United States Patent
Chen et al.

(10) Patent No.: US 9,502,519 B2
(45) Date of Patent: Nov. 22, 2016

(54) SEMICONDUCTOR DEVICE AND METHOD FOR FABRICATING THE SAME

(71) Applicant: UNITED MICROELECTRONICS CORP., Hsin-Chu (TW)

(72) Inventors: Hsin-Yu Chen, Hsinchu County (TW); Sheng-Hao Lin, Hsinchu County (TW); Huai-Tzu Chiang, Tianan (TW); Hao-Ming Lee, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 39 days.

(21) Appl. No.: 14/636,125

(22) Filed: Mar. 2, 2015

(65) Prior Publication Data
US 2016/0211368 A1 Jul. 21, 2016

(30) Foreign Application Priority Data

Jan. 19, 2015 (TW) .............................. 104101660 A

(51) Int. Cl.
| H01L 21/336 | (2006.01) |
| H01L 29/792 | (2006.01) |
| H01L 29/423 | (2006.01) |
| H01L 29/78 | (2006.01) |
| H01L 29/66 | (2006.01) |

(52) U.S. Cl.
CPC ... *H01L 29/42392* (2013.01); *H01L 29/66712* (2013.01); *H01L 29/7827* (2013.01)

(58) Field of Classification Search
CPC ................................................ H01L 29/42392
USPC .................. 438/261–262; 257/316–319, 326
See application file for complete search history.

(56) References Cited

U.S. PATENT DOCUMENTS

| 9,318,447 B2* | 4/2016 | Peng | H01L 21/02126 23/564 |
| 2015/0333078 A1* | 11/2015 | Colinge | H01L 27/11521 257/316 |
| 2015/0372149 A1* | 12/2015 | Colinge | H01L 29/788 257/316 |
| 2015/0380548 A1* | 12/2015 | Wang | H01L 29/7827 257/329 |
| 2016/0049397 A1* | 2/2016 | Chang | H01L 27/092 257/329 |
| 2016/0064541 A1* | 3/2016 | Diaz | H01L 29/66666 257/329 |
| 2016/0079239 A1* | 3/2016 | Wang | H01L 21/82348 257/328 |

OTHER PUBLICATIONS

Kelin J. Kuhn et al., IEDM Talk (The Ultimate CMOS Device and Beyond), 2012.

* cited by examiner

*Primary Examiner* — Calvin Lee
(74) *Attorney, Agent, or Firm* — Winston Hsu; Scott Margo

(57) ABSTRACT

A method for fabricating semiconductor device is disclosed. The method includes the steps of: providing a substrate having a first dielectric layer and a second dielectric layer thereon; forming a drain layer in the first dielectric layer and the second dielectric layer; forming a gate layer on the second dielectric layer; forming a channel layer in the gate layer; forming a third dielectric layer and a fourth dielectric layer on the gate layer and the channel layer; and forming a source layer in the third dielectric layer and the fourth dielectric layer.

19 Claims, 6 Drawing Sheets

SEMICONDUCTOR DEVICE AND METHOD FOR FABRICATING THE SAME

BACKGROUND OF THE INVENTION

1. Field of the Invention

The invention relates to a semiconductor device and fabrication method thereof, and more particularly, to a vertical gate-all-around field-effect transistor and fabrication method thereof.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

Nevertheless, as dimension of the device progresses into 10 nm or even more advanced 7 nm node, the current FinFET architecture gradually becomes insufficient for overcoming current physical limitations. Hence, how to create a device that is capable of maintaining adequate performance under small scale has becoming an important task in this field.

SUMMARY OF THE INVENTION

According to a preferred embodiment of the present invention, a method for fabricating semiconductor device is disclosed. The method includes the steps of: providing a substrate having a first dielectric layer and a second dielectric layer thereon; forming a drain layer in the first dielectric layer and the second dielectric layer; forming a gate layer on the second dielectric layer; forming a channel layer in the gate layer; forming a third dielectric layer and a fourth dielectric layer on the gate layer and the channel layer; and forming a source layer in the third dielectric layer and the fourth dielectric layer.

According to another aspect of the present invention, a method for fabricating semiconductor device is disclosed. The method includes the steps of: providing a substrate having a first dielectric layer thereon; forming a drain layer in the first dielectric layer; forming a second dielectric layer on the first dielectric layer and the drain layer; forming a gate layer on the second dielectric layer; forming a channel layer in the gate layer and the second dielectric layer; forming a third dielectric layer and a fourth dielectric layer on the gate layer and the channel layer; and forming a source layer in the third dielectric layer and the fourth dielectric layer.

According to another aspect of the present invention, a semiconductor device is disclosed. The semiconductor device includes: a substrate having a first dielectric layer and a second dielectric layer thereon; a drain layer in the first dielectric layer; a gate layer on the second dielectric layer; a channel layer in the gate layer and on the drain layer; a third dielectric layer and a fourth dielectric layer on the gate layer; and a source layer in the fourth dielectric layer and on the channel layer, wherein the source layer, the channel layer, and the drain layer comprise different material.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
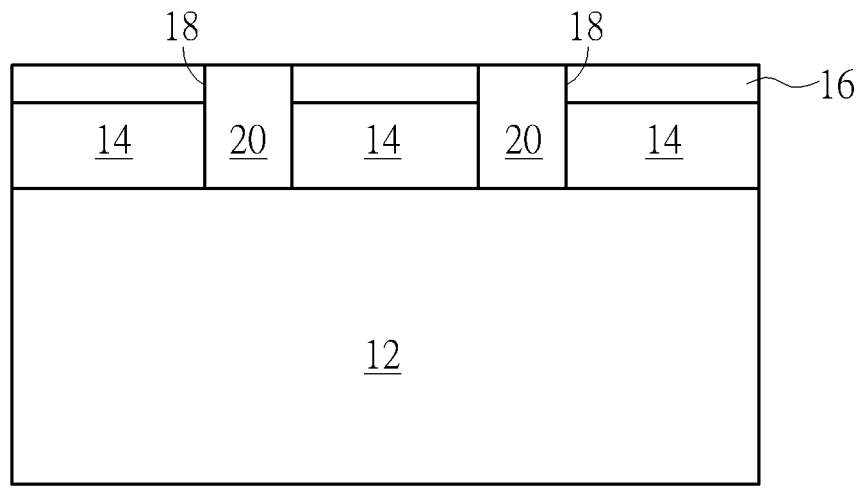
FIGS. 1-5 illustrate a method for fabricating semiconductor device according to a first embodiment of the present invention.

Referring to FIGS. 1-5, FIGS. 1-5 illustrate a method for fabricating semiconductor device according to a first embodiment of the present invention. As shown in FIG. 1, a substrate 12, such as a silicon substrate, an epitaxial silicon substrate, a silicon carbide substrate, or silicon-on-insulator (SOI) substrate is provided, but not limited thereto. A first dielectric layer 14 and a second dielectric layer 16 are then formed sequentially on the substrate 12, and a photo-etching process is conducted by using a mask (not shown) to remove part of the second dielectric layer 16 and part of the first dielectric layer 14 to format least one opening 18 exposing the substrate 12 surface. Next, a drain layer 20 is formed on the second dielectric layer 16 and filled into the opening 18, and a planarizing process such as chemical mechanical polishing (CMP) process is conducted to remove part of the drain layer 20 and part of the second dielectric layer 16 so that the surfaces of the drain layer 20 and second dielectric layer 16 are even to each other. In this embodiment, the drain layer 20 could be formed by selective epitaxial growth process, and is preferably selected from the material consisting of silicon, germanium, germanium tin (GeSn), silicon carbide (SiC), and silicon germanium (SiGe) depending on the type of device (NMOS or PMOS) being fabricated. Nevertheless, it would also be desirable to perform co-implants during epitaxial process or perform extra ion implantation process to form lightly doped drains and drains, which are all within the scope of the present invention. Preferably, the first dielectric layer 14 and second dielectric layer 16 are composed of different material and each of the first dielectric layer 14 and second dielectric layer 16 could be selected from the group consisting of silicon dioxide, silicon nitride, and silicon oxynitride (SiON).

Figure 2:
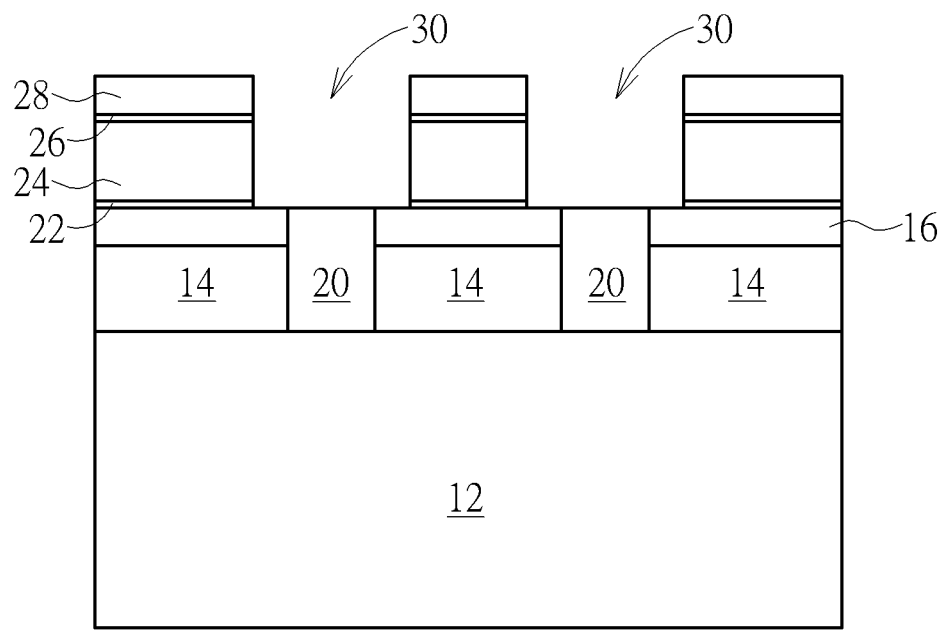

Next, as shown in FIG. 2, a first barrier layer 22, a gate layer 24, a second barrier layer 26, and a hard mask 28 are formed sequentially on the second dielectric layer 16, and a photo-etching process is conducted to remove part of the hard mask 28, part of the second barrier layer 26, part of the gate layer 24, and part of the first barrier layer 22 to form at least one opening 30 exposing the drain layer 20 and part of the second dielectric layer 16 surface.

In this embodiment, the gate layer 24 is preferably composed of doped polysilicon or non-doped polysilicon, but could also be composed of conductive material such as silicides or other metals. The first barrier layer 22 and second barrier layer 26 are preferably composed of conductive material such as titanium nitride (TiN) or tantalum nitride (TaN), but not limited thereto.

Figure 3:
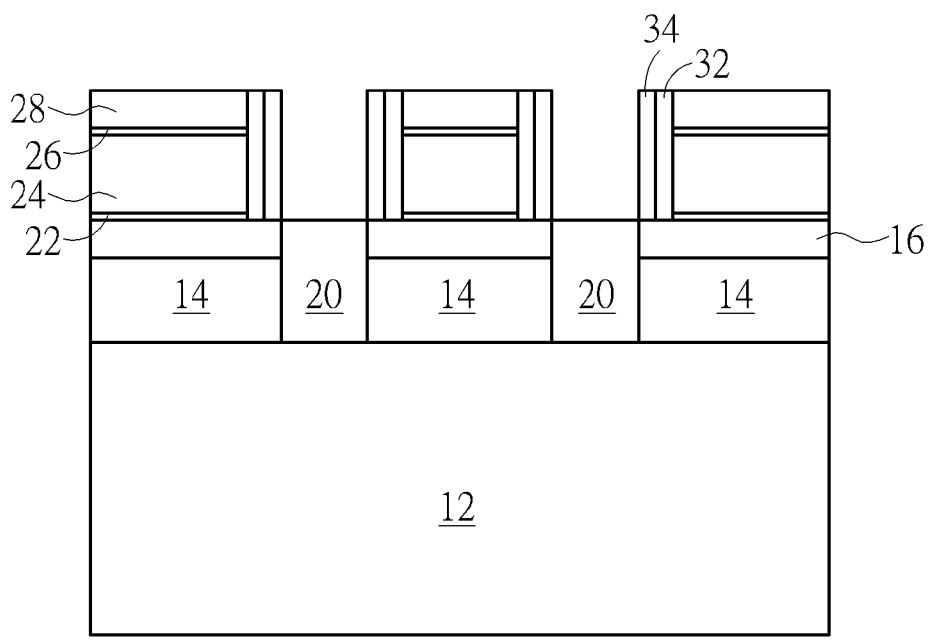

Next, as shown in FIG. 3, a work function layer 32 is formed on the hard mask 28 and in the opening 30, part of the work function layer 32 within the opening 30 and on the hard mask 28 is then removed to expose the drain layer 20, a gate dielectric layer 34 is formed on the hard mask 28 and work function layer 32 and into the opening 30, and part of the gate dielectric layer 34 is removed to expose the drain layer 20. The work function layer 32 and gate dielectric layer 34 are then formed on the sidewalls of the first barrier layer 22, the gate layer 24, the second barrier layer 26, and the hard mask 28.

In this embodiment, the gate dielectric layer 34 is preferably composed of silicon compound layer, such as material selected from the group consisting of $SiO_2$, SiN, and SiON, or other high-k dielectric materials.

The work function metal layer 32 is formed for tuning the work function of the later formed metal gates to be appropriate in an NMOS or a PMOS device. For an NMOS transistor, the work function metal layer 32 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but is not limited thereto. For a PMOS transistor, the work function metal layer 32 having a work function ranging between 4.8 eV and 5.2 eV may include titanium nitride (TiN), tantalum nitride (TaN), tantalum carbide (TaC), but is not limited thereto.

Figure 4:
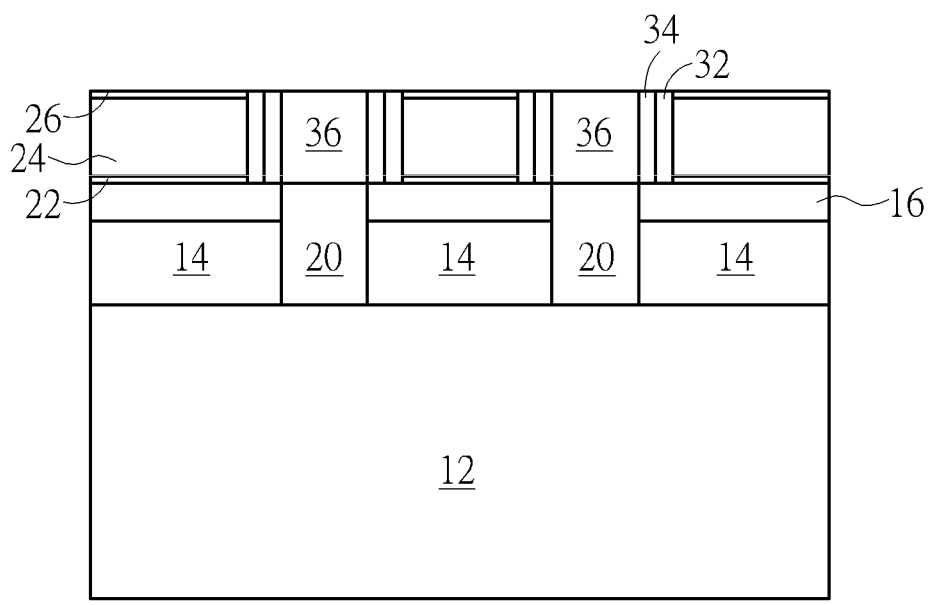

Next, as shown in FIG. 4, a channel layer 36 is formed on the gate dielectric layer 34 and filling the opening 30 completely, and a planarizing process is conducted to remove part of the channel layer 36, part of the gate dielectric layer 34, part of the work function layer 32, and all of the hard mask 28 so that the remaining channel layer 36 surface is even with the surface of the second barrier layer 26. In this embodiment, the channel layer 36 could be fabricated by using a selective epitaxial growth process, and could be composed of single crystal structure of silicon, germanium, GeSn, SiC, or SiGe, but not limited thereto.

Figure 5:
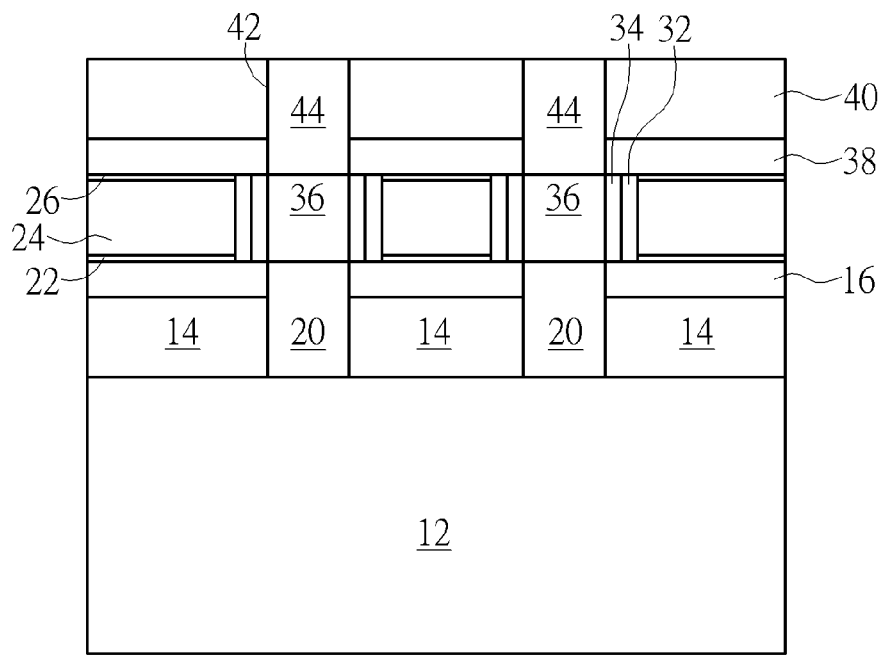

Next, as shown in FIG. 5, a third dielectric layer 38 and a fourth dielectric layer 40 are formed on the gate layer 24 and channel layer 36, and a photo-etching process is conducted by using the same mask (not shown) to remove part of the fourth dielectric layer 40 and part of the third dielectric layer 38 for forming at least an opening 42. Next, a source layer 44 is formed in the third dielectric layer 38 and fourth dielectric layer 40 by first forming a source layer 44 on the fourth dielectric layer 40 and filling the opening 42 entirely, and then performing a planarizing process to remove part of the source layer 44 and part of the fourth dielectric layer 40 so that the source layer 44 surface is even with the fourth dielectric layer 40 surface.

In this embodiment, the source layer 44 could be formed by selective epitaxial growth process, and is preferably selected from the material consisting of silicon, germanium, germanium tin (GeSn), silicon carbide (SiC), and silicon germanium (SiGe) depending on the type of device (NMOS or PMOS) being fabricated. Nevertheless, it would also be desirable to perform co-implants during epitaxial process or perform extra ion implantation process afterwards to form lightly doped drains and drains, which are all within the scope of the present invention. It should also be noted that since the source layer 44, channel layer 36, and drain layer 20 are formed separately by three distinct flows, the source layer 44, channel layer 36, and drain layer 20 are preferably composed of different material. For instance, the three layers 44, 36, and 20 could be composed of totally different compositions or compositions sharing same elements but different composition percentage. Moreover, even though the drain layer 20, channel layer 36, and source layer 44 are formed sequentially from bottom to top according to the aforementioned fabrication flow, it would also be desirable to reverse the position of the source layer 44 and drain layer 20 depending on the demand of the product, which is also within the scope of the present invention. Preferably, the third dielectric layer 38 and fourth dielectric layer 40 are composed of different material and each of the third dielectric layer 38 and fourth dielectric layer 40 could be selected from the group consisting of silicon dioxide, silicon nitride, and silicon oxynitride (SiON). This completes the fabrication of a semiconductor device according to a first embodiment of the present invention.

Referring again to FIG. 5, which further discloses a vertical gate-all-around (GAA) field-effect transistor according to the first embodiment of the present invention. As shown in FIG. 5, the vertical GAA FET includes a substrate 12, a first dielectric layer 14 and second dielectric layer 16 disposed on the substrate 12, a drain layer 20 disposed in the first dielectric layer 14 and second dielectric layer 16, a gate layer 24 disposed on the second dielectric layer 16, a channel layer 36 disposed in the gate layer 24 and directly above the drain layer 20, a third dielectric layer 38 and fourth dielectric layer 40 disposed on the gate layer 24, a source layer 44 disposed in the third dielectric layer 38 and fourth dielectric layer 40 and on top of the channel layer 36, a first barrier layer 22 disposed between the gate layer 24 and second dielectric layer 16, a second barrier layer 26 disposed between the gate layer 24 and third dielectric layer 38, a gate dielectric layer 34 surrounding the channel layer 36 and a work function layer 32 surrounding the gate dielectric layer 34. Preferably, the source layer 44, the channel layer 36, and the drain layer 20 are composed of different material, the first dielectric layer 14 and second dielectric layer 16 are composed of different material, and the third dielectric layer 38 and fourth dielectric layer 40 are composed of different material.

In this embodiment, the second dielectric layer 16 and third dielectric layer 38 are preferably utilized as a spacer for the FET, a shallow trench isolation (STI) could be formed selectively in the substrate 12 between two drain layers 20, and wells and/or deep wells having different conductive type as well as buried conductive lines electrically connected to each drain layer 20 could also be formed in the substrate 12 corresponding to the drain layer 20 depending on the type of transistor being fabricated. It should also be noted that even though the two sets of GAA FETs disclosed on left and right portion of FIG. 5 are preferably of same conductive type, it would also be desirable to form source layers and drain layers of different conductive type depending on the demand of the product, which is also within the scope of the present invention. Moreover, despite the openings corresponding to the source layer, gate layer, and drain layer are formed by photo-etching process using the same mask in this embodiment, it would also be desirable to use different masks to form openings with different sizes for further forming source layers, gate layers, and drain layers, such as source layers and drain layers with sizes different from the gate layer.

Figure 6:
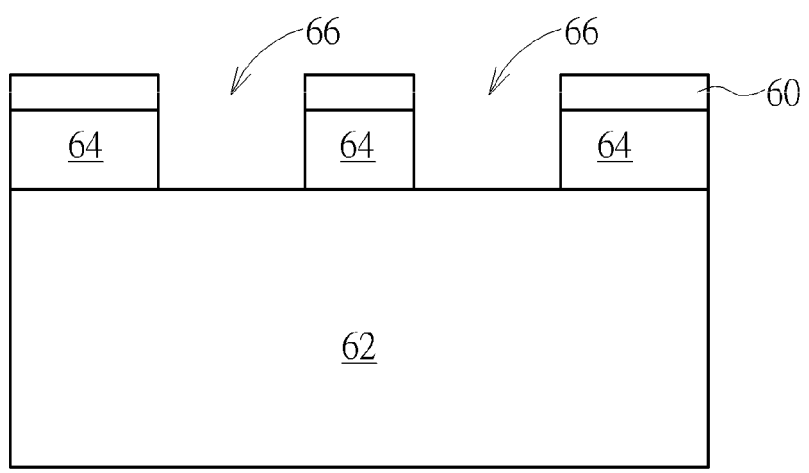
FIGS. 6-11 illustrate a method for fabricating semiconductor device according to a second embodiment of the present invention.

Referring to FIGS. 6-11, FIGS. 6-11 illustrate a method for fabricating semiconductor device according to a second embodiment of the present invention. As shown in FIG. 6, a substrate 62, such as a silicon substrate, an epitaxial silicon substrate, a silicon carbide substrate, or silicon-on-insulator (SOI) substrate is provided, but not limited thereto. A first dielectric layer 64 and a first hard mask 60 are then formed sequentially on the substrate 62, and a photo-etching process is conducted by using a mask (not shown) to remove part of the first hard mask 60 and part of the first dielectric layer 64 to form at least one opening 66 exposing the substrate 62 surface.

Figure 7:
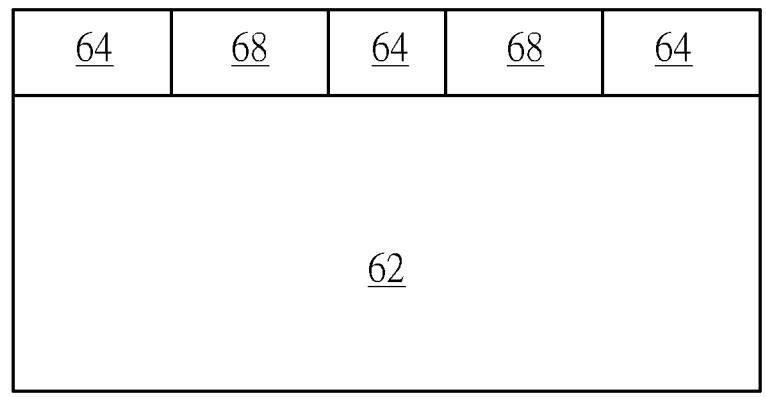

Next, as shown in FIG. 7, a drain layer 68 is formed on the first hard mask 60 and filled into the opening 66, and a planarizing process such as chemical mechanical polishing (CMP) process is conducted to remove part of the drain layer 68 and all of the first hard mask 60. This exposes the first dielectric layer 64 surface and also that surfaces of the drain layer 68 and the first dielectric layer 64 are coplanar. In this embodiment, the drain layer 68 could be formed by selective epitaxial growth process, and is preferably selected from the material consisting of silicon, germanium, germanium tin (GeSn), silicon carbide (SiC), and silicon germanium (SiGe) depending on the type of device (NMOS or PMOS) being fabricated. Preferably, the first dielectric layer 64 and first hard mask 60 are composed of different material and each of the first dielectric layer 64 and first hard mask 60 could be selected from the group consisting of silicon dioxide, silicon nitride, and silicon oxynitride (SiON).

Figure 8:
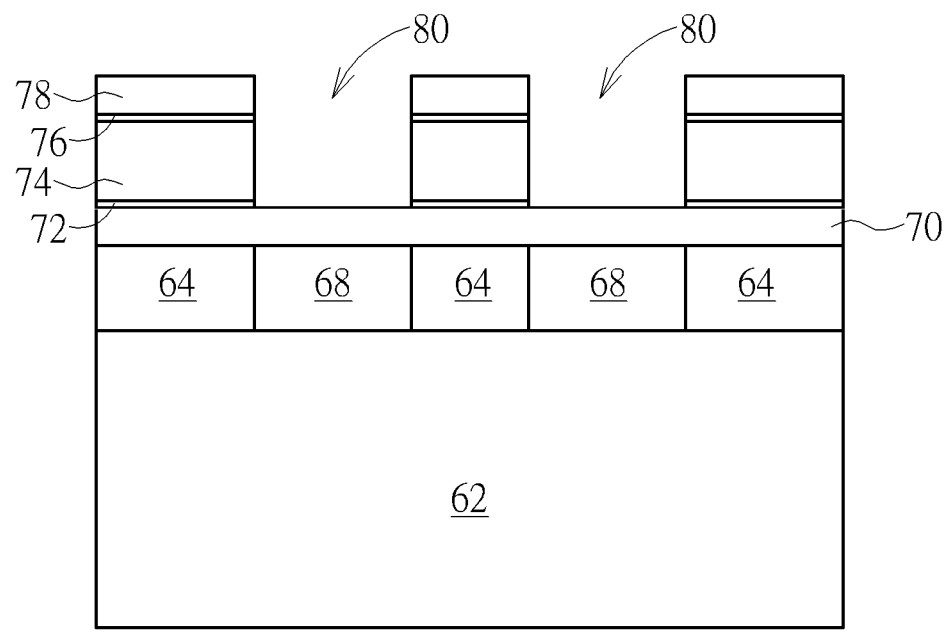

Next, as shown in FIG. 8, a second dielectric layer 70, a first barrier layer 72, a gate layer 74, a second barrier layer 76, and a second hard mask 78 are formed sequentially on the first dielectric layer 64, and a photo-etching process is conducted by using the same mask (not shown) to remove part of the second hard mask 78, part of the second barrier layer 76, part of the gate layer 74, and part of the first barrier layer 72 to form at least an opening 80 exposing the second dielectric layer 70 surface.

Similar to the first embodiment, the gate layer 74 is preferably composed of doped polysilicon or non-doped polysilicon, but could also be composed of conductive material such as silicides or other metals. The first barrier layer 72 and second barrier layer 76 are preferably composed of conductive material such as TiN or TaN, but not limited thereto.

Figure 9:
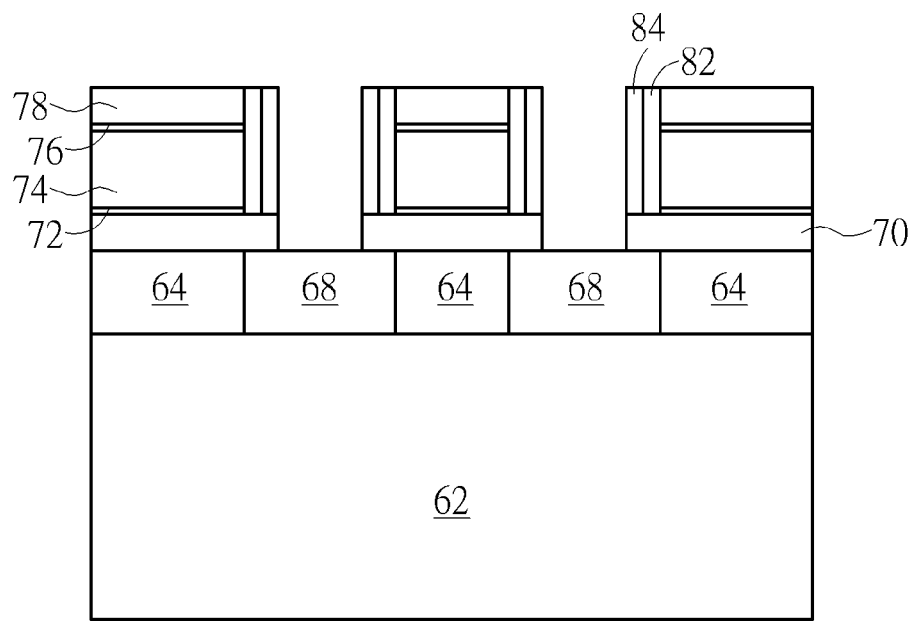

Next, as shown in FIG. 9, a work function layer 82 is formed on the second hard mask 78 and into the opening 80, part of the work function layer 82 within the opening 80 and on the second hard mask 78 is then removed to expose the second dielectric layer 70, a gate dielectric layer 84 is formed on the second hard mask 78 and work function layer 82 and into the opening 80, and part of the gate dielectric layer 84 within the opening 80 is removed to expose the second dielectric layer 70. Another etching process is conducted thereafter by using the second hard mask 78, work function layer 82, and gate dielectric layer 84 as etching mask to remove part of the second dielectric layer 70 for exposing the drain layer 68 surface.

In this embodiment, the gate dielectric layer 84 is preferably composed of silicon compound layer, such as material selected from the group consisting of $SiO_2$, SiN, and SiON, or other high-k dielectric materials.

The work function metal layer 82 is formed for tuning the work function of the later formed metal gates to be appropriate in an NMOS or a PMOS device. For an NMOS transistor, the work function metal layer 82 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but is not limited thereto. For a PMOS transistor, the work function metal layer 82 having a work function ranging between 4.8 eV and 5.2 eV may include titanium nitride (TiN), tantalum nitride (TaN), tantalum carbide (TaC), but is not limited thereto.

Figure 10:
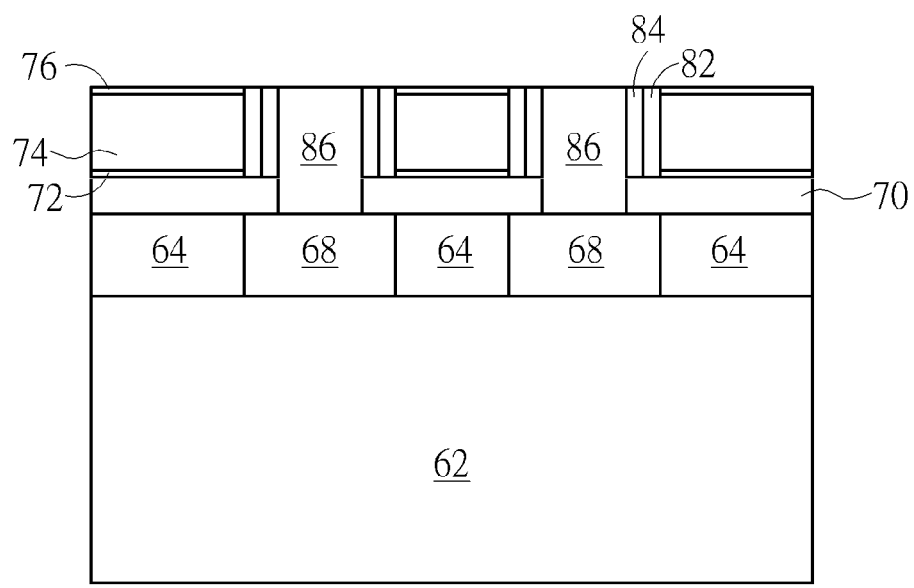

Next, as shown in FIG. 10, a channel layer 86 composed of single crystal structure is formed on the gate dielectric layer 84 and filled into the opening 80 completely, and a planarizing process is conducted to remove part of the channel layer 86, part of the gate dielectric layer 84, part of the work function layer 82, and all of the second hard mask 78 so that the remaining channel layer 86 surface is even with the surface of the second barrier layer 76. In this embodiment, the channel layer 86 is preferably composed of silicon, germanium, GeSn, SiC, or SiGe, but not limited thereto. Moreover, due to the presence of a gate dielectric layer 84 and work function layer 82 formed in the opening 80, the width of the channel layer 86 is preferably less than the width of the drain layer 68.

Figure 11:
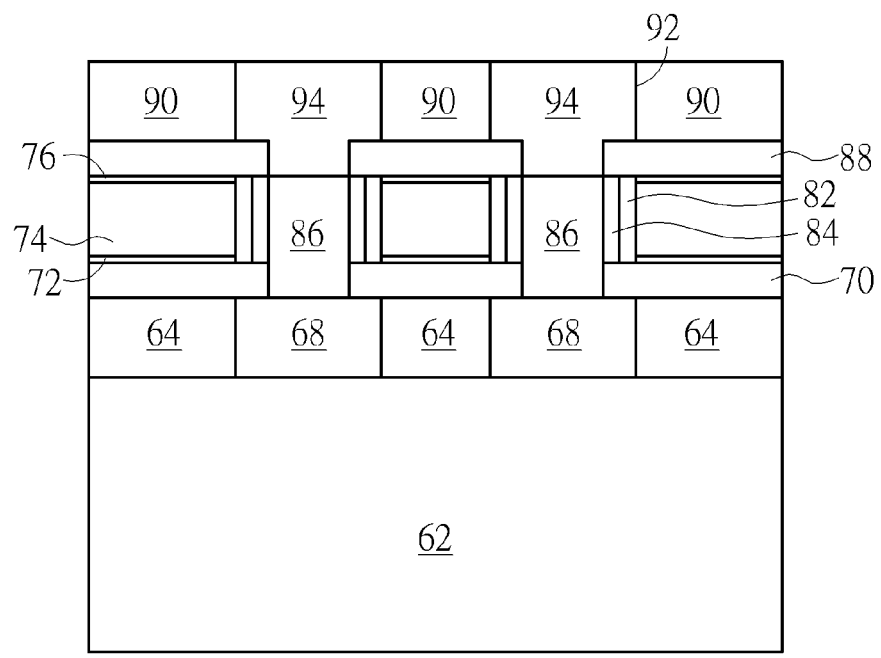

Next, as shown in FIG. 11, a third dielectric layer 88 and a fourth dielectric layer 90 are formed on the gate layer 74 and channel layer 86, and a photo-etching process is conducted to remove part of the fourth dielectric layer 90 and part of the third dielectric layer 88 for forming at least an opening 92. Preferably, the third dielectric layer 88 and fourth dielectric layer 90 are composed of different material and each of the third dielectric layer 88 and fourth dielectric layer 90 could be selected from the group consisting of silicon dioxide, silicon nitride, and silicon oxynitride (SiON). As the third dielectric layer 88 and the fourth dielectric layer 90 are composed of different material thereby having different etching selectivity, another etching process could be conducted to expand the opening 92, particularly the opening 92 within the fourth dielectric layer 90. Next, a source layer 94 is formed on the fourth dielectric layer 90 and filled into the opening 92, and a planarizing process is conducted to remove part of the source layer 94 and part of the fourth dielectric layer 90 so that the surfaces of the source layer 94 and fourth dielectric layer 90 are coplanar. In this embodiment, the source layer 94 is preferably selected from the material consisting of silicon, germanium, germanium tin (GeSn), silicon carbide (SiC), and silicon germanium (SiGe) and the source layer 94, channel layer 86, and drain layer 68 are preferably composed of different material. This completes the fabrication of a semiconductor device according to a second embodiment of the present invention.

Referring again to FIG. 11, which further depicts a vertical GAA FET structure according to another embodiment of the present invention. As shown in FIG. 11, the vertical GAA FET includes a substrate 62, a first dielectric layer 64 and second dielectric layer 70 disposed on the substrate 62, a drain layer 68 disposed in the first dielectric layer 64, a gate layer 74 disposed on the second dielectric layer 70, a channel layer 86 disposed in the gate layer 74 and second dielectric layer 70 and directly above the drain layer 68, a third dielectric layer 88 and fourth dielectric layer 90 disposed on the gate layer 74, a source layer 94 disposed in the third dielectric layer 88 and fourth dielectric layer 90 and directly above the channel layer 86, a first barrier layer 72 disposed between the gate layer 74 and second dielectric layer 70, a second barrier layer 76 disposed between the gate layer 74 and third dielectric layer 88, a gate dielectric layer 84 surrounding the channel layer 86 and a work function layer 82 surrounding the gate dielectric layer 84. Preferably, the source layer 94, the channel layer 86, and the drain layer 68 are composed of different material, the first dielectric layer 64 and second dielectric layer 70 are composed of different material, and the third dielectric layer 88 and fourth dielectric layer 90 are composed of different material.

In contrast to the first embodiment, as the top surface of the channel layer 86 of this embodiment is coplanar to the top surface of the gate layer 74, the bottom surface of the channel layer 86 is coplanar to the top surface of the first dielectric layer 64, or viewing from another perspective, the channel layer 86 of this embodiment is formed to shift downward such that the drain layer 68 is only disposed in the first dielectric layer 64 while the source layer 94 is disposed in both third dielectric layer 88 and fourth dielectric layer 90.

Similar to the first embodiment, the second dielectric layer 70 and third dielectric layer 88 are preferably utilized as a spacer for the FET, a shallow trench isolation (STI) could be formed selectively in the substrate 62 between two drain layers 68, and wells and/or deep wells having different conductive type as well as buried conductive lines electrically connected to each drain layer 68 could also be formed in the substrate 62 corresponding to the drain layer 68 depending on the type of transistor being fabricated. It should also be noted that even though the two sets of GAA FETs disclosed on left and right portion of FIG. 11 are preferably of same conductive type, it would also be desirable to form source layers and drain layers of different conductive type depending on the demand of the product, which is also within the scope of the present invention.

Figure 12:
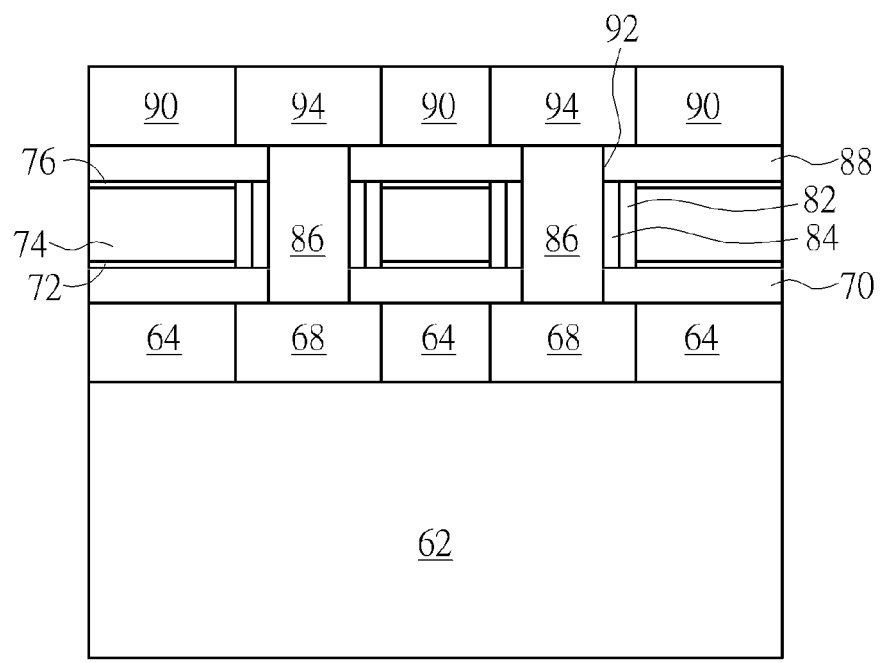
FIG. 12 illustrates a structural view of a semiconductor device according to another embodiment of the present invention.

Referring to FIG. 12, FIG. 12 illustrates a structural view of a semiconductor device according to another embodiment of the present invention. As shown in FIG. 12, instead of filling the openings 92 with source layer 94 directly after the openings 92 within the third dielectric layer 88 and fourth dielectric layer 90 are expanded, the present embodiment preferably expands the height of the original channel layer 86 by filling part of the opening 92 with material identical to that of the channel layer 86 so that the top surface of the channel layer 86 would be coplanar to the top surface of the third dielectric layer 88 and source layer 94 is then deposited into the remaining opening 92 thereafter. In other words, the top surface of the channel layer 86 of this embodiment and the top surface of the third dielectric layer 88 are preferably coplanar or even to each other, and the bottom surface of the channel layer 86 and the top surface of the first dielectric layer 64 are coplanar. Since the widths of the source layer 94 and drain layer 68 are larger than the width of the channel layer 86, it would be desirable for the present embodiment to relief the effect caused by uneven thermal distribution in the active region, provide better strain efficiency, and increase process window for the alignment accuracy between upper and lower layers.

Overall, the present invention discloses a novel vertical gate-all-around field effect transistor structure and fabrication method thereof, which preferably uses different materials for forming source, channel, and drain of the transistor so that not only shorter gate height and lower operating voltage could be achieved as device progresses into smaller scale, problem such as surface scattering commonly found in planar transistors due to insufficient capacity is also improved substantially.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate having a first dielectric layer and a second dielectric layer thereon;
   forming a drain layer in the first dielectric layer and the second dielectric layer;
   forming a gate layer on the second dielectric layer;
   forming a first barrier layer between the gate layer and the second dielectric layer;
   forming a channel layer in the gate layer;
   forming a third dielectric layer and a fourth dielectric layer on the gate layer and the channel layer;
   forming a second barrier layer between the gate layer and the third dielectric layer; and
   forming a source layer in the third dielectric layer and the fourth dielectric layer.

2. The method of claim 1, further comprising:
   performing a photo-etching process to remove part of the second dielectric layer and part of the first dielectric layer for forming an opening; and
   forming the drain layer in the opening.

3. The method of claim 1, further comprising:
   performing a photo-etching process to remove part of the fourth dielectric layer and part of the third dielectric layer for forming an opening; and
   forming the source layer in the opening.

4. The method of claim 1, wherein the first dielectric layer and the second dielectric layer comprise different material, and the third dielectric layer and the fourth dielectric layer comprise different material.

5. The method of claim 1, wherein the drain layer, the channel layer, and the source layer comprise different material.

6. The method of claim 1, further comprising:
   forming a first barrier layer on the second dielectric layer and the drain layer;
   forming the gate layer on the first barrier layer;
   forming a second barrier layer on the gate layer;
   forming a hard mask on the second barrier layer; and
   performing a photo-etching process to remove part of the hard mask, part of the second barrier layer, part of the gate layer, and part of the first barrier layer for forming an opening.

7. The method of claim 6, further comprising:
   forming a work function layer on the hard mask and in the opening;
   removing part of the work function layer in the opening to expose the drain layer;
   forming a gate dielectric layer on the work function layer and in the opening;
   removing part of the gate dielectric layer to expose the drain layer;
   forming the channel layer in the opening; and
   removing part of the channel layer, part of the gate dielectric layer, part of the work function layer, and the hard mask.

8. A method for fabricating semiconductor device, comprising:
   providing a substrate having a first dielectric layer thereon;
   forming a drain layer in the first dielectric layer;
   forming a second dielectric layer on the first dielectric layer and the drain layer;
   forming a gate layer on the second dielectric layer;
   forming a first barrier layer between the gate layer and the second dielectric layer;

forming a channel layer in the gate layer and the second dielectric layer;
forming a third dielectric layer and a fourth dielectric layer on the gate layer and the channel layer;
forming a second barrier layer between the gate layer and the third dielectric layer; and
forming a source layer in the third dielectric layer and the fourth dielectric layer.

9. The method of claim 8, further comprising:
forming a first hard mask on the first dielectric layer;
performing a photo-etching process to remove part of the first hard mask and part of the first dielectric layer for forming an opening;
forming the drain layer in the opening; and
removing part of the drain layer and the first hard mask.

10. The method of claim 8, further comprising:
performing a photo-etching process to remove part of the fourth dielectric layer and part of the third dielectric layer for forming an opening;
performing an etching process to extend the opening; and
forming the source layer in the opening.

11. The method of claim 8, wherein the first dielectric layer and the second dielectric layer comprise different material, and the third dielectric layer and the fourth dielectric layer comprise different material.

12. The method of claim 8, wherein the drain layer, the channel layer, and the source layer comprise different material.

13. The method of claim 8, further comprising:
forming a first barrier layer on the second dielectric layer and the drain layer;
forming the gate layer on the first barrier layer;
forming a second barrier layer on the gate layer;
forming a second hard mask on the second barrier layer; and
performing a photo-etching process to remove part of the second hard mask, part of the second barrier layer, part of the gate layer, and part of the first barrier layer for forming an opening.

14. The method of claim 13, further comprising:
forming a work function layer on the second hard mask and in the opening;
removing part of the work function layer in the opening to expose the second dielectric layer;
forming a gate dielectric layer on the work function layer and in the opening;
removing part of the gate dielectric layer to expose the second dielectric layer;
removing part of the second dielectric layer to expose the drain layer;
forming the channel layer in the opening; and
removing part of the channel layer, part of the gate dielectric layer, part of the work function layer and the second hard mask.

15. A semiconductor device, comprising:
a substrate having a first dielectric layer and a second dielectric layer thereon;
a drain layer in the first dielectric layer;
a gate layer on the second dielectric layer;
a first barrier layer between the gate layer and the second dielectric layer;
a channel layer in the gate layer and on the drain layer;
a third dielectric layer and a fourth dielectric layer on the gate layer;
a second barrier layer between the gate layer and the third dielectric layer; and
a source layer in the fourth dielectric layer and on the channel layer, wherein the source layer, the channel layer, and the drain layer comprise different material.

16. The semiconductor device of claim 15, further comprising:
a gate dielectric layer surrounding the channel layer; and
a work function layer surrounding the gate dielectric layer.

17. The semiconductor device of claim 15, wherein the widths of the source layer and the drain layer are larger than the width of the channel layer.

18. The semiconductor device of claim 15, wherein the top surface of the channel layer is even with the top surface of the gate layer.

19. The semiconductor device of claim 18, wherein the bottom surface of the channel layer is even with the top surface of the first dielectric layer.

* * * * *